United States Patent
Hara et al.

(10) Patent No.: US 10,445,450 B2
(45) Date of Patent: Oct. 15, 2019

(54) GENERATING METHOD OF DRAWING DATA AND CHARGED PARTICLE BEAM DRAWING METHOD

(71) Applicant: NuFlare Technology, Inc., Yokohama-shi (JP)

(72) Inventors: Shigehiro Hara, Kawasaki (JP); Kenichi Yasui, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 24 days.

(21) Appl. No.: 15/691,951

(22) Filed: Aug. 31, 2017

(65) Prior Publication Data

US 2018/0060474 A1    Mar. 1, 2018

(30) Foreign Application Priority Data

Sep. 1, 2016   (JP) .................................. 2016-171047

(51) Int. Cl.
  *G06F 17/50* (2006.01)
  *G06K 9/46* (2006.01)
  (Continued)

(52) U.S. Cl.
  CPC ............ *G06F 17/5045* (2013.01); *G03F 1/78* (2013.01); *G06K 9/4647* (2013.01);
  (Continued)

(58) Field of Classification Search
  CPC ......................... G06F 17/5045; G06K 9/4604; G06K 9/4647; G06K 9/52; G03F 7/7065;
  (Continued)

(56) References Cited

U.S. PATENT DOCUMENTS

2014/0154629 A1*  6/2014  Kinebuchi .......... H01J 37/3174
                                                        430/296

FOREIGN PATENT DOCUMENTS

JP         5-236283        9/1993
JP         8-50470         2/1996
                (Continued)

OTHER PUBLICATIONS

Office Action dated Jul. 16, 2019, in Japanese Patent Application No. 2016-171047, filed Sep. 1, 2016, w/English-language Translation.

*Primary Examiner* — Vuthe Siek
(74) *Attorney, Agent, or Firm* — Oblon, McClelland, Maier & Neustadt, L.L.P.

(57) ABSTRACT

In one embodiment, a generating method of drawing data includes generating a pixel map that includes dose amount information on each of pixels obtained by dividing a drawing area on an object into a mesh, extracting, from the pixel map, an island-shaped pixel map which is a group of multiple pixels in which the dose amount information is not zero, determining an order of definition of the dose amount information on the pixels in the island-shaped pixel map, and generating a compressed pixel map including a size of the pixels, information indicating the order of definition, coordinates of a pixel which is first in the order of definition in the island-shaped pixel map, and the dose amount information on the pixels in the island-shaped pixel map, the dose amount information being continuously defined based on the order of definition.

10 Claims, 12 Drawing Sheets

(51) Int. Cl.
  *G03F 1/78*    (2012.01)
  *H01J 37/302*  (2006.01)
  *H01J 37/317*  (2006.01)
  *G06K 9/52*    (2006.01)

(52) U.S. Cl.
  CPC ...... *H01J 37/3026* (2013.01); *H01J 37/3177* (2013.01); *G06K 9/4604* (2013.01); *G06K 9/52* (2013.01); *H01J 2237/31762* (2013.01); *H01J 2237/31764* (2013.01)

(58) Field of Classification Search
  CPC ............... G03F 1/78; G06T 7/0012; H01J 2237/31762; H01J 2237/31764; H01J 37/3026; H01J 37/3177
  See application file for complete search history.

(56) References Cited

FOREIGN PATENT DOCUMENTS

| | | |
|---|---|---|
| JP | 11-102853    | 4/1999 |
| JP | 3244766      | 1/2002 |
| JP | 2012-527764  | 11/2012 |
| JP | 2016-111325  | 6/2016 |
| JP | 2016-184605  | 10/2016 |
| JP | 2017-27988   | 2/2017 |

\* cited by examiner

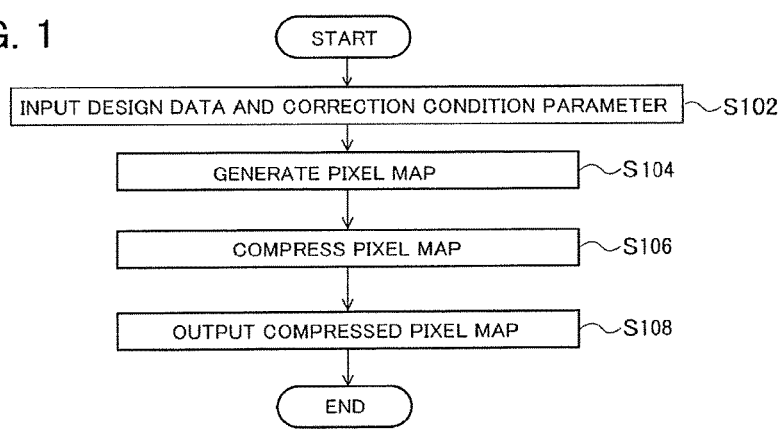
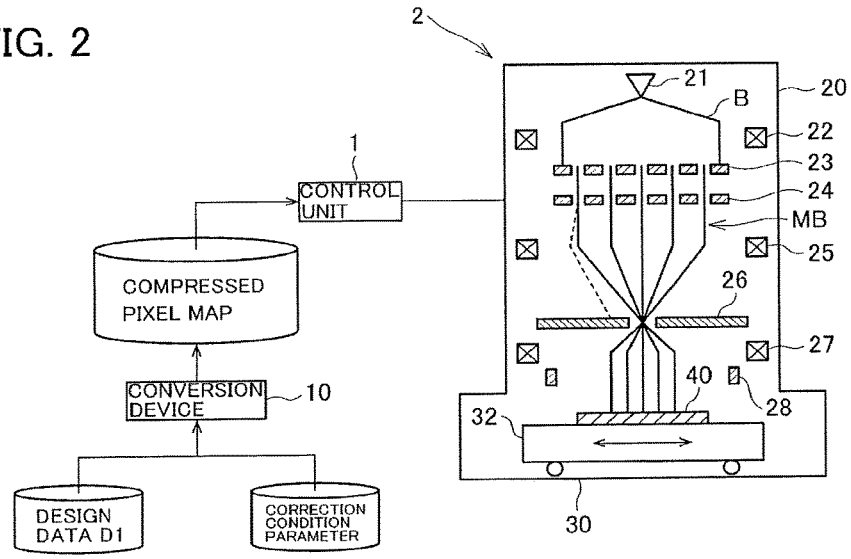

FIG. 3
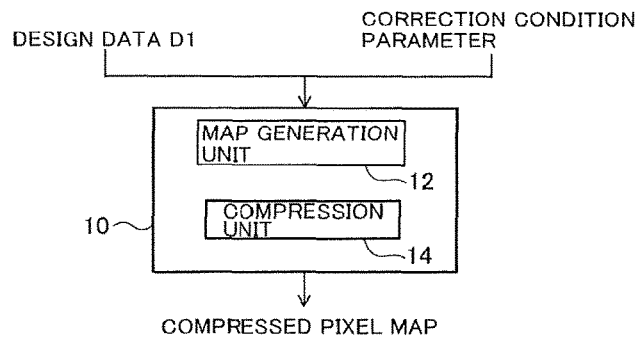
FIG. 4
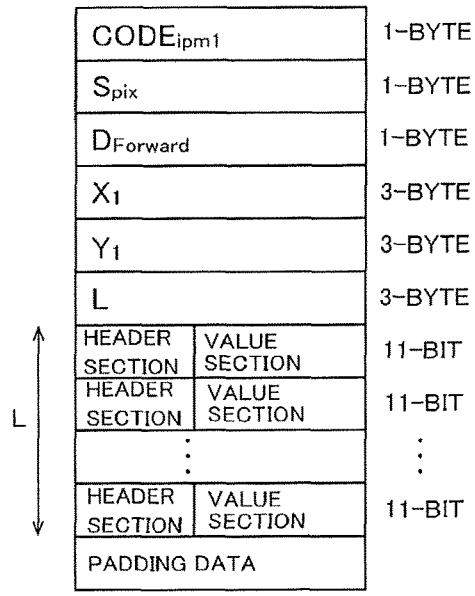
FIG. 5

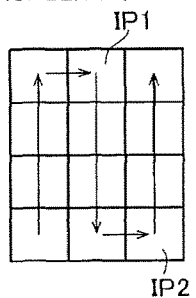
FIG. 6A
FORWARD DIRECTION
NUMBER 1 ($D_{Forward}=1$)
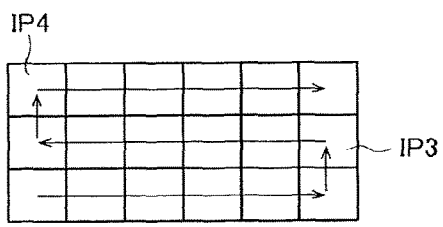
FIG. 6B
FORWARD DIRECTION
NUMBER 2 ($D_{Forward}=2$)
FIG. 7
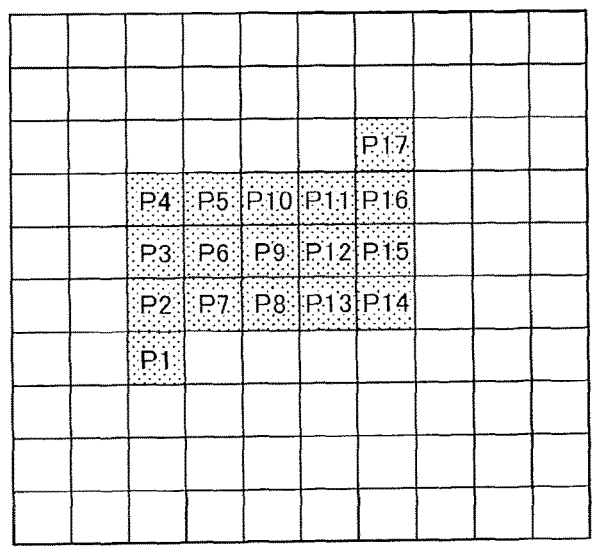

FIG. 8

| | | CODE$_{ipm1}$ | |
|---|---|---|---|
| S$_{pix}$: PIXEL SIZE | | 5(5nm) | |
| D$_{Forward}$: FORWARD DIRECTION NUMBER | | 1( HORIZONTAL SERPENTINE ) | 96 BITS |
| X$_1$: X COORDINATE OF START PIXEL | | 10(10nm) | |
| Y$_1$: Y COORDINATE OF START PIXEL | | 15(15nm) | |
| L: DATA LENGTH (BITWISE) | | 187( BIT ) | |
| | P1 | 0 | 990 |
| | P2 | 0 | 975 |
| | P3 | 0 | 975 |
| | P4 | 0 | 975 |
| | P5 | 1 | 975 |
| | P6 | 0 | 975 |
| | P7 | 0 | 975 |
| | P8 | 1 | 975 |
| | ⋮ | | |
| | P17 | 0 | 990 |
| PADDING (BYTE MATCHING) | | 5 BITS | |

(right brace spans P1–PADDING: 192 BITS)

FIG. 9A

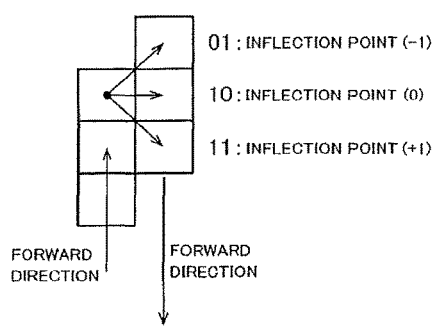

01 : INFLECTION POINT (−1)
10 : INFLECTION POINT (0)
11 : INFLECTION POINT (+1)

FORWARD DIRECTION    FORWARD DIRECTION

FIG. 9B

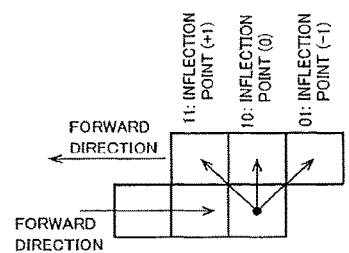

11: INFLECTION POINT (+1)
10: INFLECTION POINT (0)
01: INFLECTION POINT (−1)

FORWARD DIRECTION
FORWARD DIRECTION

FIG. 10A
FIG. 10B
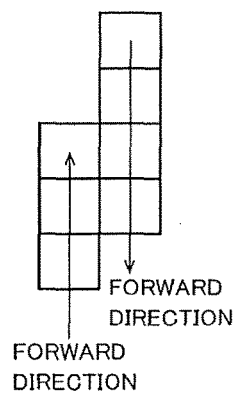
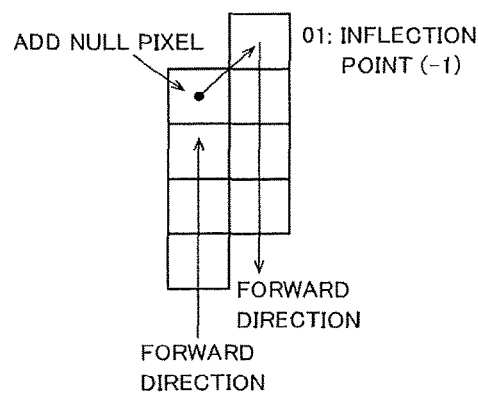
FIG. 11A
FIG. 11B
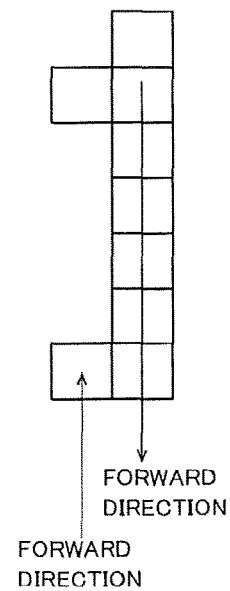
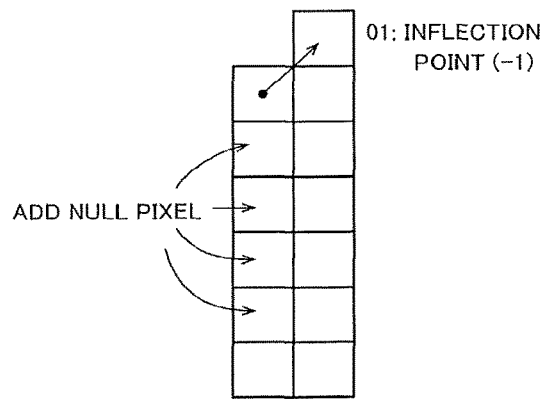

$D_{Forward}=1$ : HORIZONTAL SERPENTINE (+)
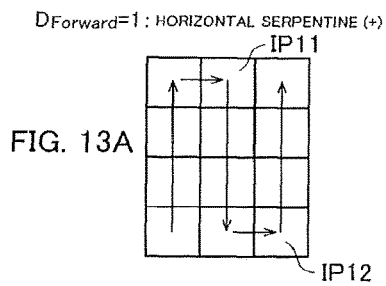
FIG. 13A
$D_{Forward}=2$ : HORIZONTAL SERPENTINE (−)
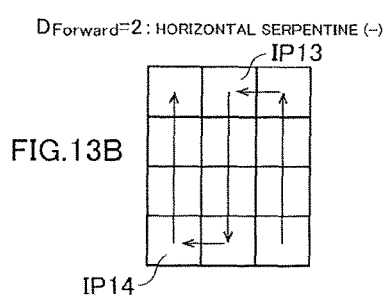
FIG.13B
$D_{Forward}=3$ : VERTICAL SERPENTINE (+)
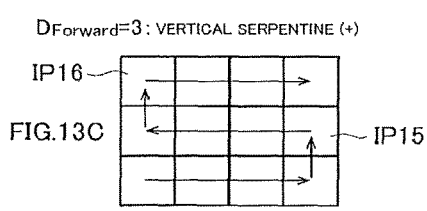
FIG.13C
$D_{Forward}=4$ : VERTICAL SERPENTINE (−)
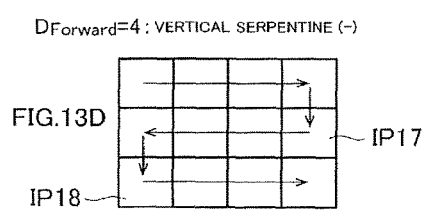
FIG.13D
$D_{Forward}=5$ : 45 DEGREES-DIRECTION SERPENTINE (I-Q)
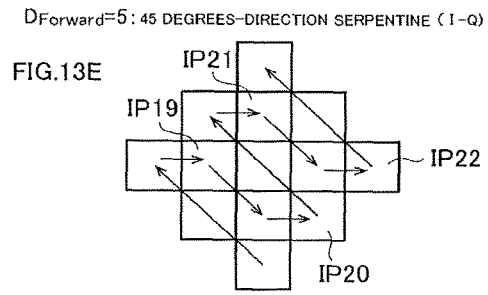
FIG.13E
$D_{Forward}=6$ : 45 DEGREES-DIRECTION SERPENTINE (II-Q)
FIG. 13F
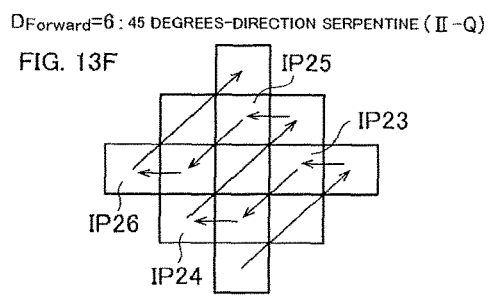
$D_{Forward}=7$ : 45 DEGREES-DIRECTION SERPENTINE (III-Q)
FIG. 13G
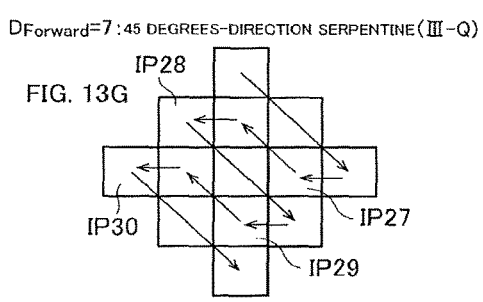
$D_{Forward}=8$ : 45 DEGREES-DIRECTION SERPENTINE (IV-Q)
FIG. 13H
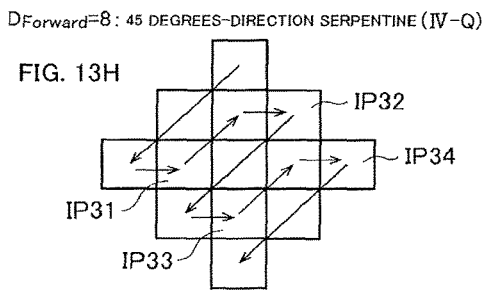

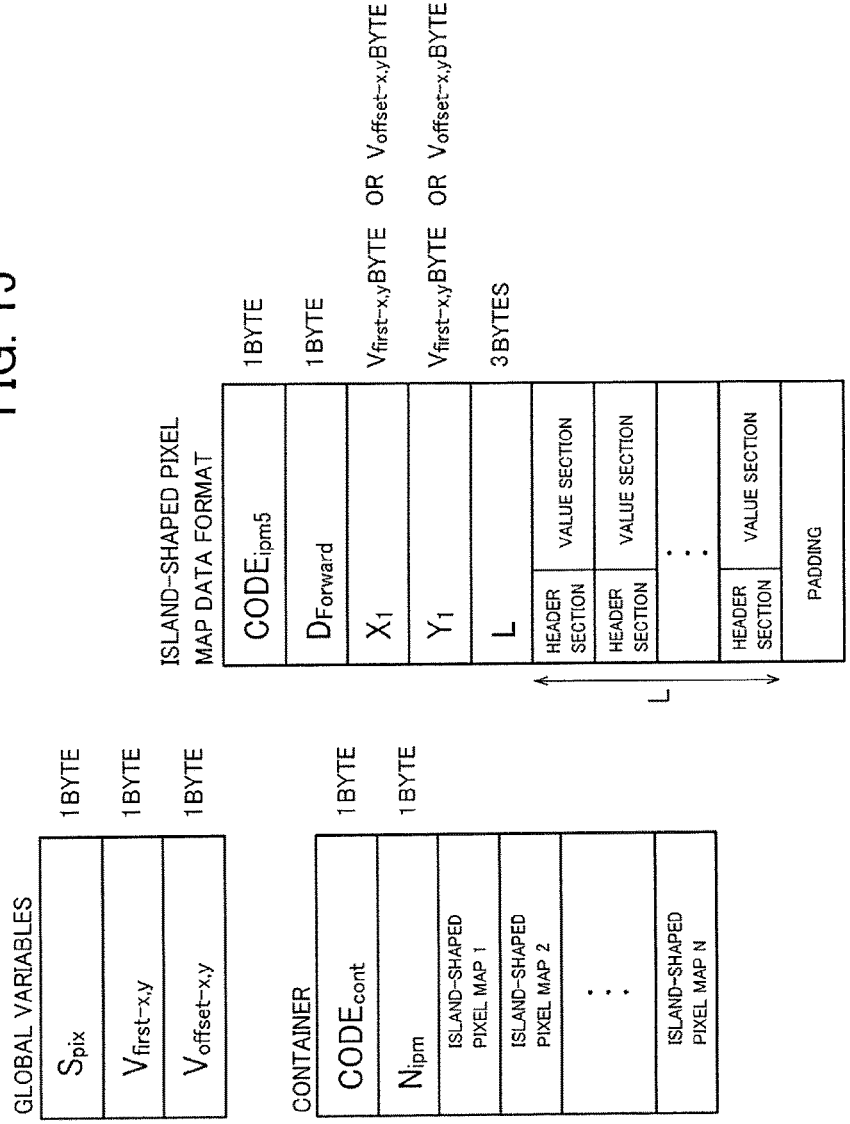

GENERATING METHOD OF DRAWING DATA AND CHARGED PARTICLE BEAM DRAWING METHOD

CROSS REFERENCE TO RELATED APPLICATION

This application is based upon and claims benefit of priority from the Japanese Patent Application No. 2016-171047, filed on Sep. 1, 2016, the entire contents of which are incorporated herein by reference.

FIELD

The present invention relates to a generating method of drawing data and a charged particle beam drawing method.

BACKGROUND

The increasing integration of LSIs has led to finer and finer circuit line widths of semiconductor devices. An approach employed to form desired circuit patterns on semiconductor devices uses a step-and-repeat exposure system to reduce and transfer, onto a wafer, a high-precision master pattern (also called a mask, or a reticle particularly when used in a stepper or scanner) formed on a piece of quartz. The high-precision original pattern is written with an electron beam writing apparatus by use of a so-called electron beam lithography technique.

When electron beam drawing is performed, first, the layout of a semiconductor integrated circuit is designed, and layout data (design data) is generated. The layout data is converted to drawing data, and is inputted to an electron beam drawing apparatus. The electron beam drawing apparatus performs drawing based on the drawing data.

Meanwhile, in order to improve a throughput, development of drawing apparatuses using multi-beam has been pursued. A large amount of beam can be irradiated at once (one shot) using a multibeam, as compared with the case where drawing is performed by a single electron beam, and thus the throughput can be significantly improved. In a multi-beam type drawing apparatus, for instance, electron beams discharged from an electron gun are passed through an aperture member having multiple holes, and a multi-beam is formed, blanking control is performed by a blanking plate on the beams, beams which are not shielded are reduced by an optical system, and are emitted to a substrate mounted on a movable stage.

For instance, in drawing using such a multi-beam or raster drawing with a single beam, drawing data (pixel data) using gray beam is generated for each pixel.

However, radiation amount data needs to be generated for each pixel of size 10 nm, for instance, thus data volume is increased, and data transfer cannot be performed efficiently.

BRIEF DESCRIPTION OF THE DRAWINGS

FIG. 1 is a flowchart illustrating a generating method of drawing data according to a first embodiment of the present invention.
FIG. 2 is a schematic configuration diagram of an electron beam drawing system according to the first embodiment.
FIG. 3 is a block diagram of a conversion device according to the first embodiment.
FIG. 4 is a diagram illustrating an example of a pixel map.
FIG. 5 is a diagram illustrating an example of a data format of an island-shaped pixel map.
FIGS. 6A and 6B are diagrams illustrating a forward direction number.
FIG. 7 is a diagram illustrating an example of a pixel map.
FIG. 8 is a diagram illustrating an example of a data format of an island-shaped pixel map.
FIGS. 9A and 9B are diagrams illustrating an example of an inflection point pixel.
FIGS. 10A and 10B are diagrams illustrating an example of addition of a null pixel.
FIGS. 11A and 11B are diagrams illustrating an example of addition of a null pixel.
FIGS. 13A to 13H are diagrams illustrating examples of a forward direction number.
FIG. 15 is a diagram illustrating an example of a data format using a container.

DETAILED DESCRIPTION

Figure 12:
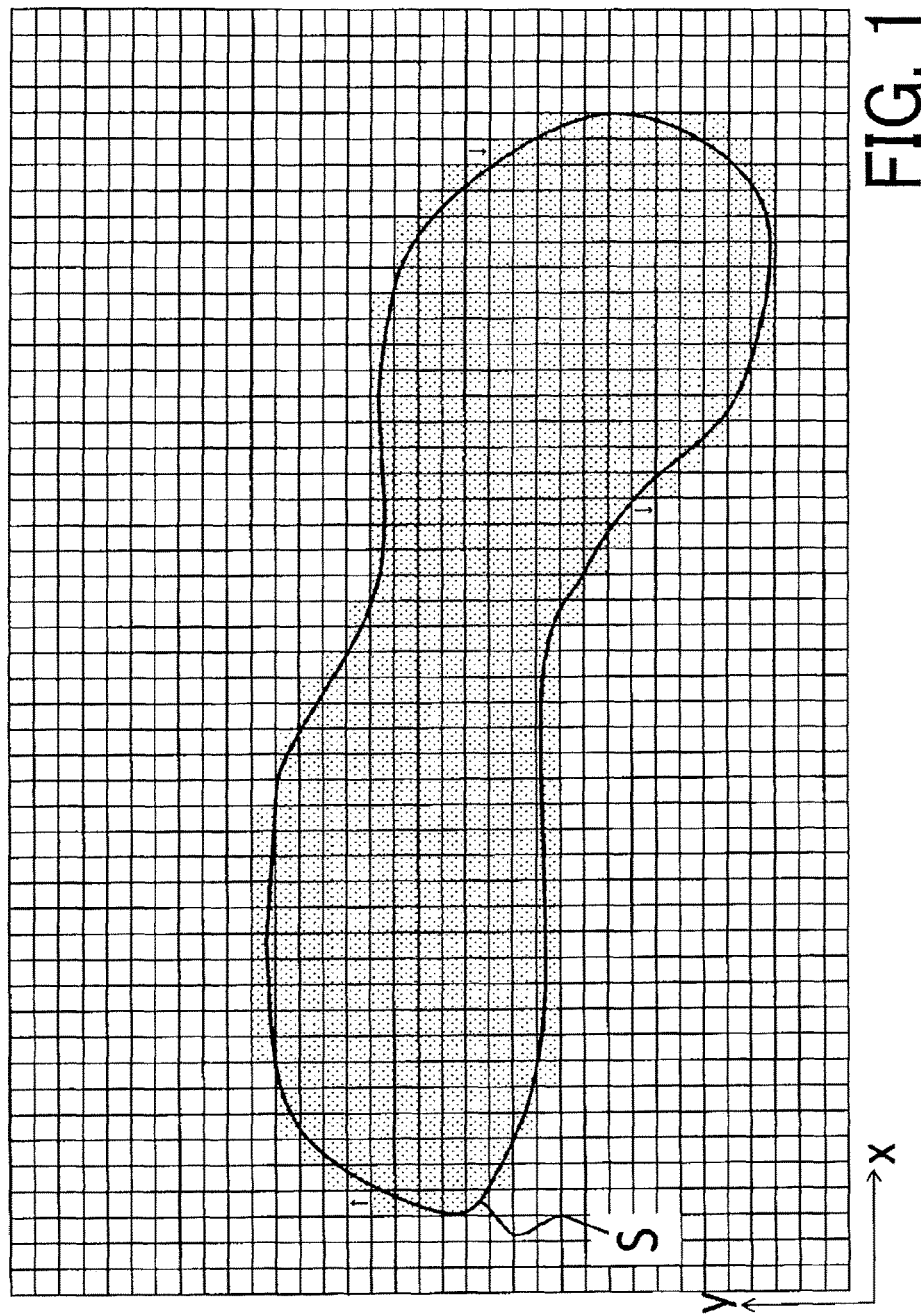
FIG. 12 is a diagram illustrating an example of a pixel map.

In one embodiment, a generating method of drawing data includes generating a pixel map that includes dose amount information on each of pixels obtained by dividing a drawing area on an object into a mesh, the object being a target on which drawing is performed by a charged particle beam drawing apparatus, extracting, from the pixel map, an island-shaped pixel map which is a group of multiple pixels in which the dose amount information is not zero, determining an order of definition of the dose amount information on the pixels in the island-shaped pixel map, and generating a compressed pixel map including a size of the pixels, information indicating the order of definition, coordinates of a pixel which is first in the order of definition in the island-shaped pixel map, and the dose amount information on the pixels in the island-shaped pixel map, the dose amount information being continuously defined based on the order of definition.

Embodiments of the present invention will be described with reference to the drawings.

[First Embodiment]

FIG. 1 is a flowchart illustrating a generating method of drawing data for compressing and outputting dose amount information held by drawing data and the data size. As illustrated in FIG. 1, the method includes a step (step S102) of inputting design data D1 and a correction condition parameter; a step (step S104) of generating a pixel map having map format dose amount information; a step (step S106) of compressing the pixel map; and a step (step S108) of outputting the compressed pixel map.

FIG. 2 is a schematic configuration diagram of an electron beam drawing system. As illustrated in FIG. 2, the electron beam drawing system includes a drawing apparatus having a control unit 1 and a drawing unit 2, and a conversion device 10.

The drawing unit 2 includes an electronic lens barrel 20 and a drawing chamber 30. In the electronic lens barrel 20, an electron gun 21, an illumination lens 22, an aperture member 23, a blanking plate 24, a reducing glass 25, a limiting aperture member 26, an objective lens 27, and a deflector 28 are disposed. The reducing glass 25 and the objective lens 27 are both configured of an electromagnetic lens, and a reduction optical system is constituted by the reducing glass 25 and the objective lens 27.

A XY stage 32 is disposed in the drawing chamber 30. A substrate 40, which is a target of drawing, is mounted on the XY stage 32. The substrate 40 is, for instance, a mask for exposure when a semiconductor device is manufactured, a semiconductor substrate (silicon wafer) in which a semiconductor device is to be manufactured, or mask blanks on which resist is applied but nothing is drawn.

In the aperture member 23, holes (openings) are formed in m rows in a vertical (y direction)×m columns in a horizontal (x direction) (m, n≥2) in a matrix form at a predetermined layout pitch. For instance, 512×512 holes are formed. Each hole is formed in a rectangle shape or a circular shape having the same dimensional shape.

An electron beam B discharged from the electron gun 21 illuminates the entire aperture member 23 by the illumination lens 22 in an approximately perpendicular direction. The electron beam B passes through multiple holes of the aperture member 23, thereby forming, for instance, rectangular multiple electron beams (multi-beam) MB.

In the blanking plate 24, for the disposition position of each hole of the aperture member 23, a corresponding passage hole is formed. In each passage hole, a set of two electrodes in a pair (a blanker: blanking deflector) is disposed. An amplifier that applies a voltage is disposed in one of the two electrodes for each beam, and the other electrode is grounded. An electron beams which passes through each passage hole is independently deflected by a voltage applied to the two electrodes in the pair. Blanking control is performed by the deflection of the electron beam.

The multi-beam MB, which passes through the planking plate 24, is reduced by the reducing glass 25, and travels towards a central hole formed in the limiting aperture member 26. An electron beam deflected by the blanker of the blanking plate 24, is displaced from the position the central hole of the limiting aperture member 26, and is shielded by the limiting aperture member 26. On the other hand, an electron beam that is not deflected by the blanker passes through the central hole of the limiting aperture member 26.

In this manner, the limiting aperture member 26 shields each beam deflected to achieve a beam OFF state by an individual blanking mechanism. A beam for one shot is formed by the beam which passes through the limiting aperture member 26 and is formed since beam ON is achieved until beam OFF is achieved.

The multi-beam MB, which passes through the limiting aperture member 26, is focused by the objective lens 27 to form a pattern image with a desired reduction rate, and the images are collectively deflected by the deflector 28, and emitted to the substrate 40. For instance, when the XY stage 32 is continuously moved, the irradiation position of a beam is controlled by the deflector 28 so that the irradiation position follows the movement of the XY stage 32.

Multi-beams MB irradiated at once are ideally arranged at a pitch which is obtained by multiplying the layout pitch of the multiple holes of the aperture member 23 by the above-mentioned desired reduction rate. The drawing apparatus performs a drawing operation by a raster scan system that sequentially irradiates with shot beams continuously, and when a desired pattern is drawn, a necessary beam according to the pattern is controlled to be beam ON by the blanking control.

The conversion device 10 generates a pixel map using design data D1 and a correction condition parameter. The design data D1 is layout data based on the layout of a semiconductor integrated circuit. A pixel map is set based on a correction condition parameter, and is formed by one file or multiple files. A compressed pixel map is such that the pixel map is compressed, and the data volume is reduced.

The control unit 1 expands the compressed pixel map, and calculates a dose amount per mesh area having a predetermined size. The control unit 1 controls the drawing unit 2 based on the calculated dose amount, and draws a desired figure pattern on the substrate 40 which is a drawing target.

FIG. 3 is a block configuration diagram of the conversion device 10. The conversion device 10 includes a map generation unit 12 that generates a pixel map using design data D1 and a correction condition parameter, and a compression unit 14 that compresses the pixel map to generate and output a compressed pixel map.

In the design data (layout data), multiple cells are disposed on a chip, and a figure is disposed in each cell.

In a pixel map, dose amount information (a dose amount or a dose modulation rate) is defined for each of pixels (mesh areas) obtained by dividing a drawing area into mesh-shaped pieces, and the pixel map has a data size according to the number of pixels. Here, a pixel map with a pattern having a low a modulation rate is discussed. FIG. 4 illustrates an example of a pixel map with a pattern having a low a modulation rate. For instance, a pixel map, in which the size of one pixel conforms to the beam size (for instance, 10 nm) of each beam included in the multi-beam MB, is generated by the map generation unit 12. In FIG. 4, a pixel with zero dose amount information is left unshaded, and a pixel with non-zero dose amount information is indicated by dot hatching. In a pixel map with a pattern having a low coverage, the data size can be reduced by defining dose amount information only for the pixels #13, #14, #17, #18, #19, #22, #23, #27, #28 with non-zero dose amount information, rather than defining dose amount information for all the pixels #1 to #40.

In this embodiment, dose amount information is defined for a group of pixels unevenly distributed in area, and dose amount information on surrounding pixels is omitted, thereby compressing the data size of the pixel map. Hereinafter, a group of pixels, for which dose amount information is defined, may be referred to as an island-shaped pixel map.

FIG. 5 illustrates an example of a data format of an island-shaped pixel map. In the data format illustrated in FIG. 5, pixel information is defined, such as 1-byte representation code ($Code_{ipm1}$), 1-byte pixel size ($S_{pix}$), 1-byte forward direction number ($D_{Forward}$) that indicates an order of definition of dose amount information, and coordinates ($X_1$, $Y_1$) each having 3-byte for a reference pixel. The reference pixel is the pixel corresponds to the first in the order of definition of dose amount information.

Before the after pixel information is defined, the dose amount information on each pixel composed of a header section and a value section is defined (disposed) continuously. In the example of FIG. 5, after pixel information is defined, dose amount information on each pixel is continuously defined.

3-byte data length (L) for all dose amount information is defined between the pixel information and the dose amount information. The dose amount information has a data length in unit of bit. Data to be processed on a computer is preferably multiples of a byte (8 bits), thus padding data is added subsequent to the dose amount information.

The forward direction number indicating an order of definition of dose amount information will be described using FIGS. 6A and 6B. First, the forward direction number 1 ($D_{Forward}$=1) illustrated in FIG. 6A sequentially defines the pixels on the first column from the reference pixel in the y direction. The position is moved from the last pixel on the first column to the adjacent inflection point pixel IP1 which is the first pixel in the definition order on the second column, and subsequently, the forward direction of definition is inverted, and pixels are sequentially defined in −y direction.

Furthermore, the position is moved from the last pixel on the second column to the adjacent inflection point pixel IP2 which is the first pixel in the definition order on the third column, and subsequently, the direction of definition order is inverted, and pixels are sequentially defined in y direction. In this manner, the dose amount information on each pixel is sequentially defined in the x direction while moving in zigzag in the y direction. Such an order of definition is referred to as a horizontal serpentine.

First, the forward direction number 2 ($D_{Forward}$=2) illustrated in FIG. 6B sequentially defines the pixels from the reference pixel in the x direction. The position is moved from the last pixel on the first row to the adjacent inflection point pixel IP3 which is the first pixel in the definition order on the second row, and subsequently, the direction of definition order is inverted, and pixels are sequentially defined in −x direction. The position is moved from the last pixel on the second row to the adjacent inflection point pixel IP4 which is the first pixel in the definition order on the third row, and subsequently, the direction of definition order is inverted, and pixels are sequentially defined in x direction. In this manner, the dose amount information on each pixel is sequentially defined in the y direction while moving in zigzag in the x direction. Such an order of definition is referred to as a vertical serpentine.

The compression unit 14 extracts a group of pixel elements (island-shaped pixel map) with non-zero dose amount information, selects one of the horizontal serpentine and the vertical serpentine based on the shape of the island-shaped pixel map, and determines an order of definition of dose amount information on the pixels, a reference pixel and an inflection point pixel in the island-shaped pixel map.

In addition, the compression unit 14 converts the dose amount information into a data structure including a header section and a value section. An example of a header section and a value section is illustrated in the following Table 1. The header section has a 1-bit value that indicates whether or not a pixel is an inflection point. The value section indicates a dose amount or a dose modulation rate, and is 10 bits in the example of Table 1.

TABLE 1

| HEADER SECTION (1 BIT) | | VALUE SECTION |
|---|---|---|
| VALUE | DEFINITION | |
| 0 | 1 PIXEL IS ADDED IN FORWARD DIRECTION | UNSIGNED 10 BITS |
| 1 | INFLECTION POINT | |

An example of data compression processing for a pixel map will be described using FIG. 7 and FIG. 8. FIG. 7 illustrates an example of a pixel map with a pattern having a low coverage, dose amount information is defined for 17 pixels P1 to P17 out of 100 pixels (10 pixels in the x direction, 10 pixels in the y direction), and the dose amount information on other pixels is zero. It is assumed that the order of definition of dose amount information is the horizontal serpentine, and the dose amount information is defined in the order of pixels P1, P2, . . . , P17.

FIG. 8 illustrates an example of a data structure of a compressed pixel map obtained by performing data compression processing on the pixel map illustrated in FIG. 7. The forward direction number $D_{Forward}$, "1" is defined to be 1 that indicates the horizontal serpentine. The coordinates $X_1$, $Y_1$ are defined to be the coordinates of the pixel P1.

Subsequent to the pixel information, dose amount information on the pixels P1 to P17 are continuously defined. As illustrated in FIG. 7, the pixel P5, P8, P11, P14 serve as inflection points. The header section of the dose amount information on the pixels P5, P8, P11, P14 of inflection points has "1", and the header section of the dose amount information on other pixels has "0".

In the value section of the dose amount information, a dose amount or a dose modulation rate is expressed by unsigned 10 bits. In FIG. 8, although the value section has a decimal representation for the convenience of explanation, the value section actually has a binary representation. The dose amount information on one pixel including a header section and a value section is 11 bits. Since the number of pixels is 17, the data length L is 187 (=11×17) [bit].

At this point, in order to make the data volume in units of byte, 5-bit padding data is added subsequent to the dose amount information.

The data size the representation code ($Code_{ipm1}$), the pixel size ($S_{pix}$), the forward direction number ($D_{Forward}$), the coordinates ($X_1$, $Y_1$), and the data length (L) is 96 bits. The dose amount information on the pixels P1 to P17 and the data size of the padding data are 192 bits together. The data size of the data structure illustrated in FIG. 8 is 288 bits.

When for all 100 pixels illustrated in FIG. 7, 10-bit dose amount information is defined, the data size is 1000 bits. However, the data size after compression is 288 bits and it has been verified that data size can be reduced.

When obtaining a compressed pixel map, the control unit 1 of the drawing apparatus determines pixels in which dose amount information is defined and the order of definition of the dose amount information based on the forward direction number ($D_{Forward}$) the coordinates $X_1$, $Y_1$ of a reference pixel, and the values in header sections of the dose amount information, assigns the value sections of the dose amount information to corresponding pixels, and expands the compressed pixel map.

In this manner, in this embodiment, a pixel map is generated only in portions corresponding to a pattern, thus the data size of the pixel map can be reduced. Therefore, the efficiency of data transfer to the control unit 1 of the drawing apparatus can be improved. According to this embodiment, particularly in a pattern having a relatively low coverage, effective data compression can be performed, and the data transfer efficiency can be improved.

The design data D1 and correction condition parameter may be inputted to the conversion device 10, and drawing data with a compressed correction map may be generated. The drawing data referred to herein is data in which the shape and position of each figure converted from the design data D1 by the conversion device 10 is defined, and the drawing data has no information on dose amount. The information on the correction dose amount is defined in a correction map. The correction map is set according to information obtained by correction calculation based on the correction condition parameter, and is formed by one file or multiple files. A compressed correction map is a map obtained by compressing the correction map by the same technique as in the embodiment. It is to be noted that in this case, the mesh size of the correction map may be larger than the diameter of each beam included in a multi-beam. As an example, in a correction map for reducing dimensional variation due to the proximity effect specific to an EUV mask having an extremely short influence radius of 1 µm or less, for instance, 300 nm to 400 nm, the mesh size is approximately 30 nm which is 1/10 of the influence radius. When such a configuration is adopted, the control unit 1 has a function of converting drawing data to a pixel map having a pixel size that conforms to the beam diameter of the multi-beam.

[Second Embodiment]

In the first embodiment described above, a pixel serving as an inflection point has the same position as the position the preceding pixel in the x direction (or y direction). For instance, in the example of FIG. 6A, the inflection point pixels IP1, IP2 have the same positions as the positions of the respective preceding pixels in the y direction. Also, in the example of FIG. 6B, the inflection point pixels IP3, IP4 have the same position as the positions of the respective preceding pixels in the x direction.

As illustrated in the following Table 2, 2 bits are allocated to the header section of dose amount information, and as illustrated in FIGS. 9A and 9B, the position of an inflection point pixel in the x direction (or the y direction) may be displaced from the position of the preceding pixel by one pixel. The allocation of 2 bits to the header section allows the direction of movement of each inflection pixel from the preceding pixel to be expressed.

TABLE 2

| HEADER SECTION (2 BITS) | | VALUE |
|---|---|---|
| VALUE | DEFINITION | SECTION |
| 00 | 1 PIXEL IS ADDED IN FORWARD DIRECTION | UNSIGNED 10 BITS |
| 01 | INFLECTION POINT (−1) | |
| 10 | INFLECTION POINT (0) | |
| 11 | INFLECTION POINT (+1) | |

For instance, when an inflection point pixel is adjacent to the preceding pixel, and both have the position in the forward direction, the header section has 10. When the position of an inflection point pixel in the forward direction is displaced by one pixel with respect to the preceding pixel, the header section has 01 or 11 according to the direction of the displacement.

When the header section is represented by 2 bits, the representation code of the data format is different from the representation code in the above-described first embodiment illustrated in FIG. 8, and for instance, is defined by $Code_{ipm2}$.

As illustrated in FIG. 10A, when the position of a pixel serving as an inflection point is displaced by two or more pixels from the preceding pixel, as illustrated in FIG. 10B, the compression unit 14 adds a null pixel with a dose amount of zero so that the displacement is one pixel.

Also, when intermediate pixels in the forward direction are missing as illustrated in FIG. 11A, the compression unit 14 adds null pixels to fill the missing portion as illustrated in FIG. 11B.

The example of data compression processing for a pixel map will be described using FIG. 12. FIG. 12 illustrates an example of a pixel map with a pattern having a low coverage, and dose amount information is defined for 535 pixels indicated by dot hatching out of 1750 pixels (50 pixels in the x direction, 35 pixels in the y direction), and the dose amount information on other pixels is zero.

The data compression processing according to this embodiment is performed on the pixel map. The data format is the same as that illustrated in FIG. 5 except that the representation code is $Code_{ipm2}$, and the header section of dose amount information has 2 bits. Pixel S serves as the reference pixel, and the order of definition of dose amount information is the horizontal serpentine.

Null pixels are added to a portion at which the position of an inflection point pixel is displaced by two or more pixels from the preceding pixel. A pixel labeled with ↑ mark or ↓ mark in FIG. 12 is an added null pixel. In the example, 3 null pixels are added.

The dose amount information on a pixel formed of a 2-bit header section and a 10-bit value section is 12 bits. The number of pixels in which dose amount information is defined, including additional null pixels is 538 pieces, thus the data length L is 6456 pits. At this point, the data length L is a multiple of 8, and thus no padding (zero bit) data is added.

The data size the representation code ($Code_{ipm2}$), the pixel size ($S_{pix}$), the forward direction number ($D_{Forward}$), the coordinates ($X_1$, $Y_1$), and the data length (L) is 96 bits. The data size of the island-shaped pixel map after compression is 6552 bits.

When for all 1750 pixels illustrated in FIG. 12, 10-bit dose amount information is defined, the data size is 17500 bits. However, the data size after compression is 6552 bits and it has been verified that data size can be reduced.

[Third Embodiment]

Although dose amount information on each pixel is represented by full bit (unsigned 10 bits) in the second embodiment described above, the dose amount information may be represented by the difference from the dose amount information on the adjacent pixel (the preceding pixel), and the data may be further compressed. In this case, the header section is composed of 3 bits consisting of a 2-bit first header section that indicates the direction of movement of a pixel serving as an inflection point from the preceding pixel, and a 1-bit second header section that indicates whether the value section adopts full bit representation or difference representation.

An example of a header section and a value section is illustrated in the following Table 3. In the example of Table 3, the full bit representation is allocated unsigned 10 bits, and the difference representation is allocated signed 6 bits (signed 1 bit+5 bits). The difference representation is not limited to signed 6 bits, and it is sufficient that the difference representation have less number of bits than full bit.

TABLE 3

| FIRST HEADER SECTION (2 BITS) | |
|---|---|
| VALUE | DEFINITION |
| 00 | 1 PIXEL IS ADDED IN FORWARD DIRECTION |
| 01 | INFLECTION POINT (−1) |
| 10 | INFLECTION POINT (0) |
| 11 | INFLECTION POINT (+1) |

| SECOND HEADER SECTION (1 BIT) | | |
|---|---|---|
| VALUE | DEFINITION | VALUE SECTION |
| 0 | FULL BIT REPRESENTATION | UNSIGNED 10 BITS |
| 1 | DIFFERENCE REPRESENTATION | SIGNED 6 BITS (SIGNED 1 BIT + 5 BITS (±32 GRADATIONS)) |

When the difference between the dose amount information on a pixel and the dose amount information on the preceding pixel is 32 gradations or less, the compression unit 14 represents the dose amount information by a 2-bit first header section related to an inflection point, a 1-bit second header section that indicates the value section uses the difference representation, and a signed 6-bit value section that indicates the difference from the dose amount information on the preceding pixel. When the difference between the dose amount information on a pixel and the dose amount information on the preceding pixel is greater than 32 gradations, the value section is represented in full bit (unsigned 10 bits).

As illustrated in Table 3, when a 3-bit header section (a 2-bit first header section and a 1-bit second header section) is used, the representation code of the data format is different from the representation code in the above-described first and second embodiments, and for instance, is defined by $Code_{ipm3}$.

The case will be described, where the dose amount information on 535 pixels and 3 null pixels in the pixel map illustrated in FIG. 12 are compressed by using the above-described difference representation. It is assumed that the difference between the dose amount information on each pixel and the dose amount information on the preceding pixel is 32 gradations or less.

The additional null pixels are assumed to use the full bit representation. Also, a subsequent pixel (an inflection point pixel) of each additional null pixel is also assumed to use the full bit representation.

The data size of dose amount information on the first reference pixel is a 3-bit header section, plus a 10-bit value section using the bit representation, thus 13 bits. The data size of dose amount information on 3 additional null pixels, and 3 inflection point pixels subsequent to the 3 additional null pixels is 13 bits similarly.

The data size of dose amount information on 531 pixels other than the above pixels a 3-bit header section, plus a 6 bits value section using the difference representation, thus 9 bits.

The data size of dose amount information on 535 pixels and 3 null pixels is 4870 (=13×7+9×531) bits. In order to make the data volume in units of byte, 2-bit padding data is added subsequent to the dose amount information. The data size the representation code ($Code_{ipm3}$), the pixel size ($S_{pix}$), the forward direction number ($D_{Forward}$) the coordinates ($X_1, Y_1$), and the data length (L) is 96 bits. The data size of the island-shaped pixel map using the difference representation after compression is 4968 bits, and it has been verified that data size can be further reduced.

The forward direction number indicating the order of definition of dose amount information is not limited to what is illustrated in FIGS. 6A and 6B. For instance, as illustrated in FIGS. 13A to 13H, the horizontal serpentine, the vertical serpentine, or 45 degrees-direction serpentine may be defined. In the examples illustrated in FIGS. 13A to 13H, IP11 to IP34 serve as inflection point pixels.

[Fourth Embodiment]

In the first to third embodiments described above, a group of pixels is represented by one island-shaped pixel map. However, depending of the shape of a group of pixels, the data size can be efficiently compressed by dividing the group and representing the divided pieces by multiple island-shaped pixel maps.

Figure 14A:
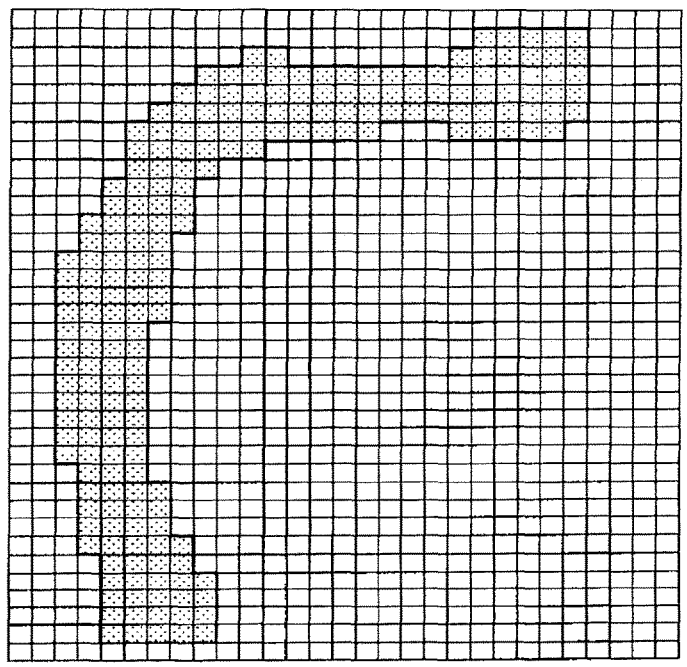
FIGS. 14A and 14B are illustrating an example in which a group of pixels is divided into multiple island-shaped pixel maps.
Figure 14B:
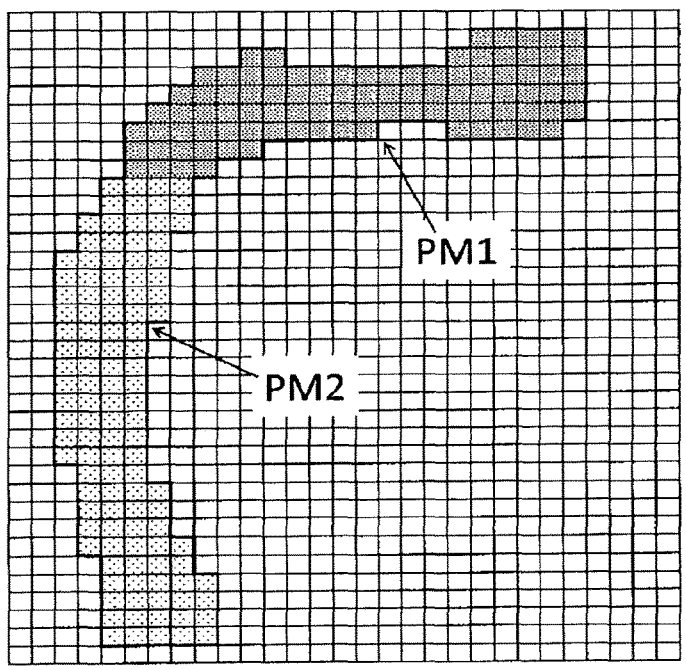

For instance, when a group of pixels has an approximate L-shape as illustrated in FIG. 14A, as illustrated in FIG. 14B, it is preferable to divide the group into two island-shaped pixel maps PM1, PM2 for processing.

FIG. 15 illustrates an example of a data format when a group of pixels is divided into multiple island-shaped pixel maps. The data format illustrated in FIG. 15 includes a container in which data of multiple island-shaped pixel maps is continuously defined, and global variables.

As global variables, pixel size ($S_{pix}$), the byte equivalent ($V_{first-x, y}$) to the coordinates of the first pixel of the first island-shaped pixel map in the container, and for the second island-shaped pixel map, the byte equivalent ($V_{offset-x, y}$) to the relative coordinates from the last pixel of the preceding island-shaped pixel map to the first pixel of the second island-shaped pixel map are each defined as 1 byte.

In the container, data of multiple island-shaped pixel maps is continuously defined subsequent to a container header section consisting of 1-byte representation code ($CODE_{cont}$) and 1-byte number of island-shaped pixel maps ($N_{ipm}$).

The data format of the island-shaped pixel map is nearly similar to that of the first to third embodiments described above except that the pixel size ($S_{pix}$) is defined as a global variable and is omitted, and for the second and later island-shaped pixel maps, the start pixel coordinates ($X_1, Y_1$) is the relative coordinates (displacement) from the last pixel of the preceding island-shaped pixel map.

Figure 16:
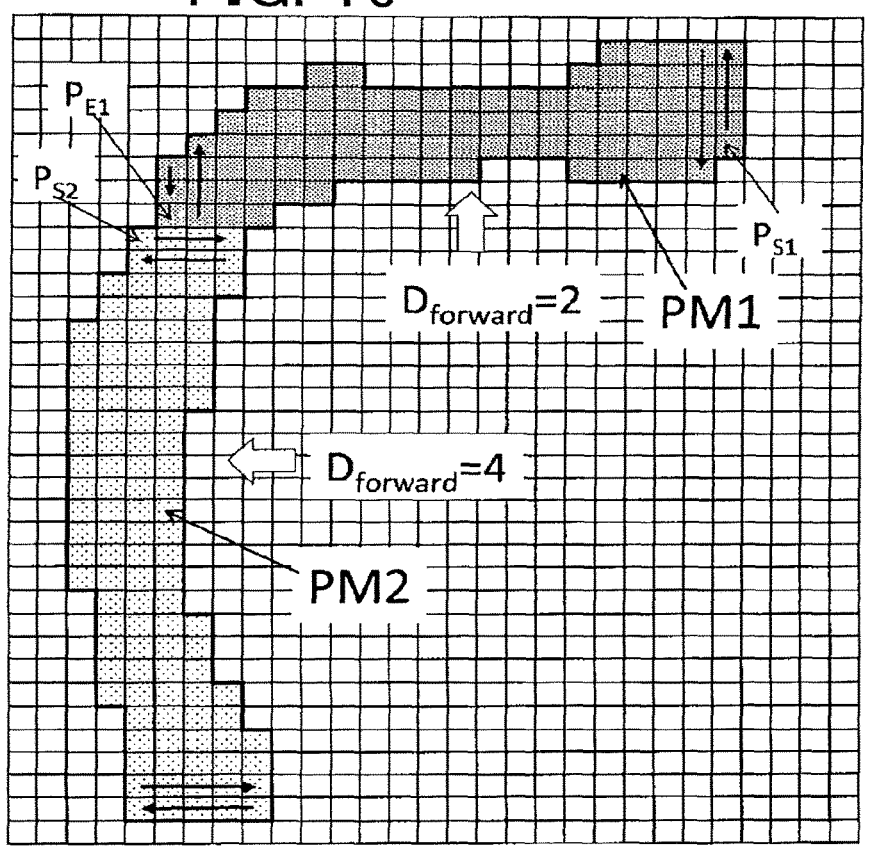
FIG. 16 is a diagram illustrating an example of an island-shaped pixel map according to a fourth embodiment.

For instance, as illustrated in FIG. 16, a group of pixels is divided into island-shaped pixel maps PM1, PM2, and the island-shaped pixel tap PM1 is defined from pixel $P_{S1}$ in −X direction in accordance with horizontal serpentine (see 13B), and the island-shaped pixel map PM2 is defined from pixel $P_{S2}$ in −y direction in accordance with vertical serpentine (see 13D).

The start pixel coordinates ($X_1, Y_1$) of the island-shaped pixel map PM2 is defined by the relative coordinates from pixel $P_{E1}$ that is the last in the island-shaped pixel map PM1 to pixel $P_{S2}$.

The data compression when such a container is used will be described. In the container, it is assumed that the byte equivalent ($V_{first-x, y}$) to the coordinates of the first pixel in the first island-shaped pixel map is 3 bytes, and the byte equivalent ($V_{offset-x, y}$) to an offset is 1 byte. In addition, it is assumed that the difference between the dose amount information on each pixel and the dose amount information on the preceding pixel is 32 gradations or less, and the difference representation explained in the third embodiment of described above is used.

The data size of the island-shaped pixel map PM1 illustrated in FIG. 16 is 936 bits, and the data size of the island-shaped pixel map PM2 is be 1080 bits. The data size of the container including the container header section is 2032 bits.

Figure 17:
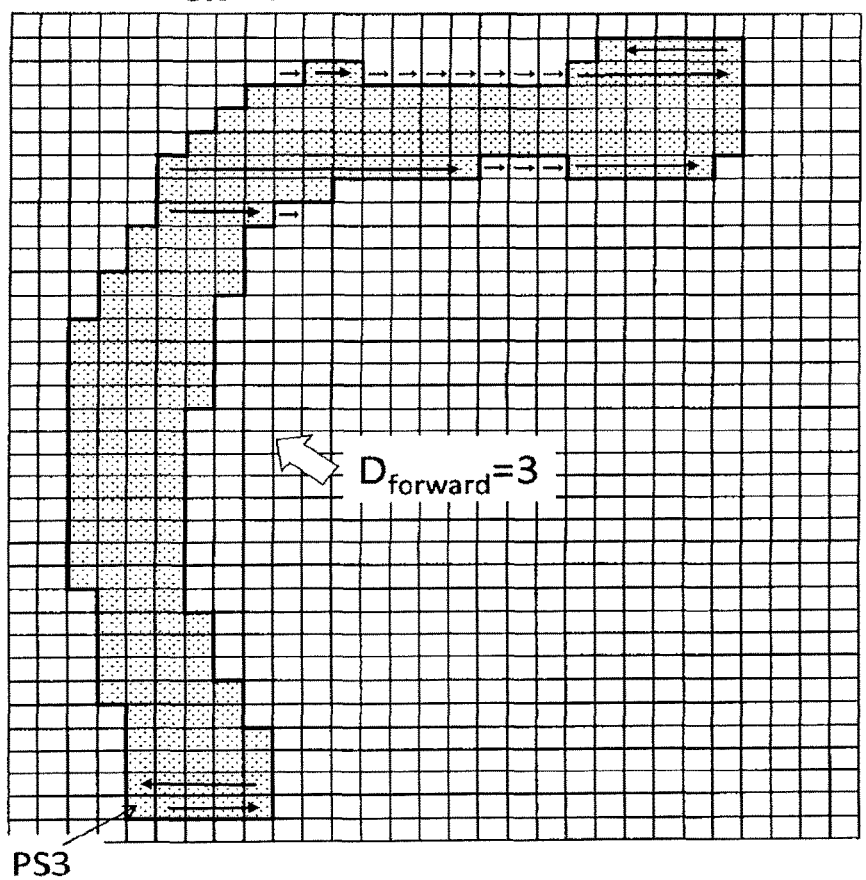
FIG. 17 is a diagram illustrating an island-shaped pixel map according to a comparative example.

In contrast, as illustrated in FIG. 17, when the group of pixels is treated as a single island-shaped pixel map without being divided, and is defined from pixel $P_{S3}$ in +y direction by the vertical serpentine (see 13C), 12 null pixels indicated by arrow symbol -> in FIG. 17 are added, and the data size is 2088 bits.

Figure 18:
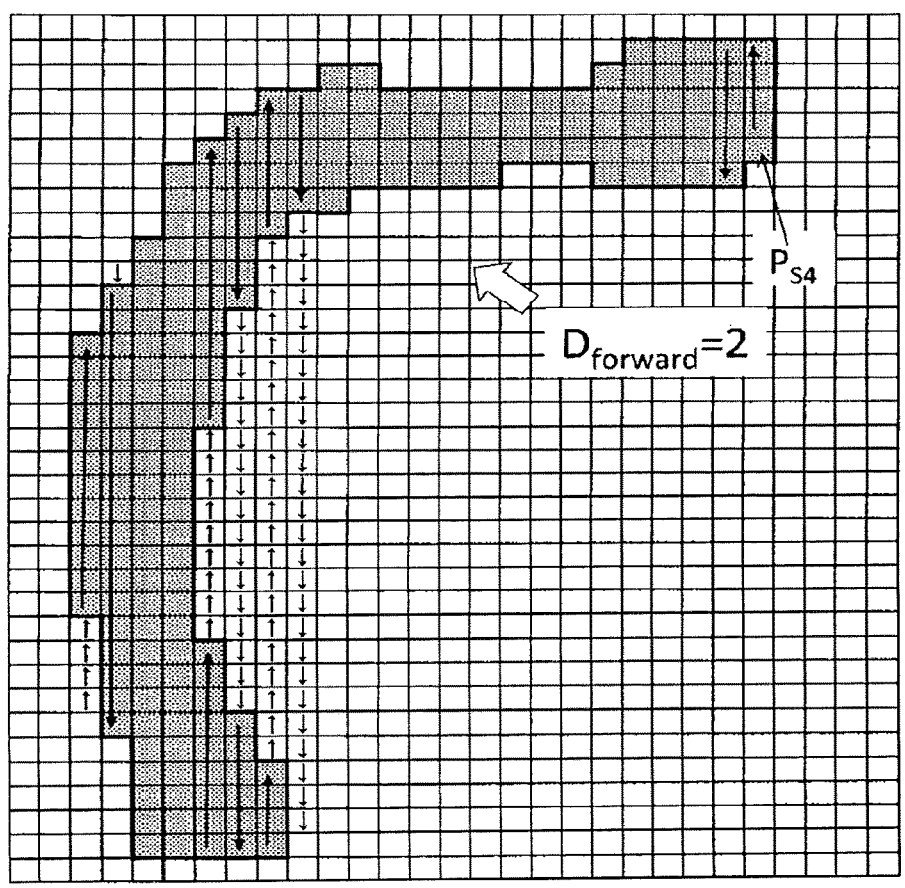
FIG. 18 is a diagram illustrating an island-shaped pixel map according to a comparative example.

Also, as illustrated in FIG. 18, when the group of pixels is treated as a single island-shaped pixel map without being divided, and is defined from pixel $P_{S4}$ in −X direction by the horizontal serpentine (see 13B), 79 null pixels indicated by arrows ↓ or ↑ in FIG. 18 are added, and the data size is 2712 bits.

It has been verified that data size can be reduced by using a container and dividing a group of pixels into multiple island-shaped pixel maps.

Although the drawing apparatus using multi-beam has been described in the embodiments described above, a drawing apparatus in accordance with a gaussian beam drawing system using a single beam, or a variable shaped beam drawing system may be used. In the embodiments described above, as an example of charged particle beam, a configuration using an electron beam has been described. However, the charged particle beam is not limited to the electron beam, and other charged particle beams such as ion beam may be used.

At least part of the conversion device 10 described in the above embodiments may be implemented in either hardware including electric circuits or software. When implemented in software, a program that realizes at least part of functions of the conversion device 10 may be stored on a recording medium such as a flexible disk or CD-ROM and read and executed by a computer including electric circuits. The recording medium is not limited to a removable recording medium such as a magnetic disk or optical disk, but may be a non-removable recording medium such as a hard disk device or memory.

The program that realizes at least part of the functions of the conversion device 10 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pixel map compressing method comprising:
   generating a pixel map that includes dose amount information on each of pixels obtained by dividing a drawing area on a substrate into a mesh, the substrate being a target on which drawing is performed by a charged particle beam drawing apparatus;
   extracting, from the pixel map, an island-shaped pixel map which is a group of multiple pixels in which the dose amount information is not zero;
   determining an order of definition of the dose amount information on the pixels in the island-shaped pixel map based on a shape of the island-shaped pixel map; and
   generating a compressed pixel map including a size of the pixels, information indicating the order of definition, coordinates of a pixel which is first in the order of definition in the island-shaped pixel map, and the dose amount information on the pixels in the island-shaped pixel map, the dose amount information being continuously defined based on the order of definition.

2. The method according to claim 1,
   wherein the pixel map is generated based on design data based on a layout drawn on the substrate and a correction condition parameter.

3. The method according to claim 1,
   wherein to the island-shaped pixel map, the pixels on nth column (n is an integer greater than or equal to 1) are sequentially defined in a first direction, and the pixels on (n+1)th column are sequentially defined in a second direction opposite to the first direction.

4. The method according to claim 3,
   wherein a pixel which is first in the order of definition on the (n+1)th column is set to an inflection point pixel, and
   the dose amount information on each of the pixels in the compression pixel map includes a header section that indicates whether or not the pixel is the inflection point pixel.

5. The method according to claim 4,
   wherein a position of a pixel which is last in the order of definition on the nth column, and a position of the pixel which is first in the order of definition on the (n+1)th column are same or displaced by one pixel in the first direction.

6. The method according to claim 5,
   wherein when the position of the pixel which is last in the order of definition on the nth column and the position of the pixel which is first in the order of definition on the (n+1)th column are displaced by two or more pixels in the first direction, a null pixel is added to the nth column to cause the displacement to be one pixel, and the compressed pixel map is generated.

7. The method according to claim 3,
   wherein when an intermediate pixel on the nth column is missing, a null pixel is added to fill a missing portion, and the compressed pixel map is generated.

8. The method according to claim 1,
   wherein a group consisting of multiple pixels in which the dose amount information is not zero is divided into a first island-shaped pixel map and a second island-shaped pixel map,
   in the first island-shaped pixel map, the dose amount information on the pixels is sequentially defined in a first direction or in a second direction opposite to the first direction, and
   in the second island-shaped pixel map, the dose amount information on the pixels is sequentially defined in a third direction perpendicular to the first direction or in a fourth direction opposite to the third direction.

9. The method according to claim 1,
   wherein the dose amount information is converted to representation of a difference from dose amount information on a pixel which is preceding in the order of definition, and the compressed pixel map is generated.

10. A charged particle beam drawing method comprising:
    generating a pixel map that includes dose amount information on each of pixels obtained by dividing a drawing area on a substrate into a mesh, the substrate being a target on which drawing is performed by a charged particle beam drawing apparatus;
    extracting, from the pixel map, an island-shaped pixel map which is a group of multiple pixels in which the close amount information is not zero;
    determining an order of definition of the dose amount information on the pixels in the island-shaped pixel map based on a shape of the island-shaped pixel map;
    generating a compressed pixel map including a size of the pixels, information indicating the order of definition, coordinates of a pixel which is first in the order of definition in the island-shaped pixel map, and the dose amount information on the pixels in the island-shaped pixel map, the dose amount information being continuously defined based on the order of definition;
    transferring the compressed pixel map to the charged particle beam drawing apparatus; and
    drawing a figure pattern by irradiating the substrate with a charged particle beam based on a dose amount which is calculated in a following manner: the compressed pixel map is expanded and the dose amount per mesh area having a predetermined size is calculated by the charged particle beam drawing apparatus.

* * * * *